United States Patent
Oliver et al.

(10) Patent No.: US 9,644,118 B2
(45) Date of Patent: *May 9, 2017

(54) METHOD OF RELEASABLY ATTACHING A SEMICONDUCTOR SUBSTRATE TO A CARRIER

(71) Applicants: Rohm and Haas Electronic Materials LLC, Marlborough, MA (US); Dow Global Technologies LLC, Midland, MA (US)

(72) Inventors: Mark S. Oliver, Charlestown, MA (US); Zhifeng Bai, Midland, MI (US); Michael K. Gallagher, Hopkinton, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/636,981

(22) Filed: Mar. 3, 2015

(65) Prior Publication Data

US 2016/0257861 A1    Sep. 8, 2016

(51) Int. Cl.
*H01L 21/44* (2006.01)
*H01L 21/48* (2006.01)
(Continued)

(52) U.S. Cl.
CPC ............... *C09J 11/06* (2013.01); *C09J 4/00* (2013.01); *H01L 21/6835* (2013.01);
(Continued)

(58) Field of Classification Search
CPC ............... H01L 24/14; H01L 21/6835; H01L 2224/13647; H01L 2221/68318;
(Continued)

(56) References Cited

U.S. PATENT DOCUMENTS

| 4,661,193 A | 4/1987 | Kirchhoff et al. |
| 6,559,215 B2 | 5/2003 | Mills et al. |

(Continued)

FOREIGN PATENT DOCUMENTS

| JP | 2008-255270 | 10/2008 |
| JP | 2011-168663 | 9/2011 |

(Continued)

OTHER PUBLICATIONS

Co-Pending U.S. Appl. No. 14/069,348, filed Oct. 31, 2013.
(Continued)

*Primary Examiner* — Kimberly Rizkallah
*Assistant Examiner* — Dilinh Nguyen
(74) *Attorney, Agent, or Firm* — S. Matthew Cairns

(57) ABSTRACT

Compositions containing an adhesive material, a release additive and a copper passivation agent are suitable for temporarily bonding two surfaces, such as a semiconductor substrate active side and a carrier substrate. These compositions are useful in the manufacture of electronic devices where a temporary bonding of a component to a substrate having a copper surface is desired.

10 Claims, 3 Drawing Sheets

(51) Int. Cl.
*H01L 21/50* (2006.01)
*C09J 11/06* (2006.01)
*H01L 23/00* (2006.01)
*H01L 21/683* (2006.01)
*C09J 4/00* (2006.01)

(52) U.S. Cl.
CPC ............. *H01L 24/10* (2013.01); *H01L 24/14* (2013.01); *H01L 2221/6834* (2013.01); *H01L 2221/68318* (2013.01); *H01L 2221/68327* (2013.01); *H01L 2221/68377* (2013.01); *H01L 2221/68381* (2013.01); *H01L 2224/13147* (2013.01); *H01L 2224/13647* (2013.01)

(58) Field of Classification Search
CPC . H01L 2221/68381; H01L 2221/68327; H01L 2224/13147; H01L 2221/68377; H01L 2224/05139; H01L 2224/05144; H01L 2224/05164; H01L 2224/05169; H01L 2224/05173; H01L 2224/05176; H01L 2224/05178; H01L 2224/05239; H01L 2224/05244; H01L 2224/05264; H01L 2224/05269; H01L 2224/05273; H01L 24/10
USPC .................................................. 438/686, 650
See application file for complete search history.

(56) References Cited

U.S. PATENT DOCUMENTS

| | | | | |
|---|---|---|---|---|
| 6,722,950 | B1* | 4/2004 | Dabral | ............... B23H 5/08 257/E21.583 |
| 7,482,249 | B2 | 1/2009 | Jakob et al. | |
| 7,713,835 | B2 | 5/2010 | Pillalamarri | |
| 7,759,050 | B2 | 7/2010 | Kessel et al. | |
| 7,883,991 | B1 | 2/2011 | Wu et al. | |
| 8,092,628 | B2 | 1/2012 | Hong et al. | |
| 8,349,706 | B2 | 1/2013 | Noda | |
| 9,034,139 | B2 | 5/2015 | Koellnberger et al. | |
| 9,269,623 | B2* | 2/2016 | Oliver | ............... C09J 5/00 |
| 2004/0121618 | A1 | 6/2004 | Moore | |
| 2008/0090380 | A1 | 4/2008 | Gardner et al. | |
| 2008/0200011 | A1* | 8/2008 | Pillalamarri | ........ H01L 21/6835 438/458 |
| 2009/0017323 | A1 | 1/2009 | Webb et al. | |
| 2009/0176349 | A1 | 7/2009 | Jakob et al. | |
| 2009/0218560 | A1 | 9/2009 | Flaim et al. | |
| 2010/0028671 | A1 | 2/2010 | Mitsui et al. | |
| 2010/0038035 | A1 | 2/2010 | Noda et al. | |
| 2010/0043608 | A1 | 2/2010 | Jakob | |
| 2010/0263794 | A1 | 10/2010 | George et al. | |
| 2011/0263095 | A1 | 10/2011 | Takeuchi et al. | |
| 2011/0272092 | A1 | 11/2011 | Richter | |
| 2011/0318938 | A1 | 12/2011 | Takeuchi et al. | |
| 2012/0013013 | A1 | 1/2012 | Sadaka et al. | |
| 2012/0028438 | A1 | 2/2012 | Richter | |
| 2012/0034437 | A1 | 2/2012 | Puligadda et al. | |
| 2012/0291944 | A1 | 11/2012 | Higashibeppu et al. | |
| 2013/0071658 | A1 | 3/2013 | Nomura et al. | |
| 2013/0192754 | A1 | 8/2013 | Dukkipati et al. | |
| 2014/0117504 | A1* | 5/2014 | Oliver | ........................ C09J 5/00 257/618 |
| 2014/0141048 | A1* | 5/2014 | Rolf | ........................ A61L 29/14 424/400 |

FOREIGN PATENT DOCUMENTS

| | | |
|---|---|---|
| WO | WO2006/093639 | 8/2006 |
| WO | WO2009/003029 A2 | 12/2008 |
| WO | WO2011/100030 A1 | 8/2011 |
| WO | WO2013/013986 | 1/2013 |

OTHER PUBLICATIONS

Wimplinger et al, "Equipment and process solutions for low cost high volume manufacturing of 3D integrated devices," Pan Pacific Symposium Conference Proceedings, Feb. 14, 2012.
Chris Rosenthal, "Room temperature mechanical lift off debonding the next step in temporary wafer handling for 3D IC," Chip Scale Review, Jan./Feb. 2012, pp. 26-27.
Search report for corresponding Taiwan Application No. 105104515 dated Jul. 29, 2016.
Search report for corresponding European Application No. 16 15 0925 dated Jul. 14, 2016.

* cited by examiner

METHOD OF RELEASABLY ATTACHING A SEMICONDUCTOR SUBSTRATE TO A CARRIER

The present invention relates to the field of semiconductor manufacture, and more particularly to the temporary bonding of a semiconductor wafer to a substrate.

In many areas of manufacturing, parts to be worked on (processed) must be temporarily attached to another work piece or a support. For example, in the manufacture of semiconductor devices it is often necessary to support semiconductor wafers for various manufacturing steps. The requirement for thinner die packages has driven semiconductor manufacturers to thin semiconductor wafers. Such thinning is typically accomplished by temporarily adhering the front side of a semiconductor wafer, which contains active devices, to a carrier (support) in order to allow for grinding of the backside of the wafer. Also, thinned wafers may be subject to further processing operations, such as metallization, cleaning, etching, and the like. After such processing, the thinned wafer must be detached (debonded) from the carrier. If the temporary adhesive bonds too strongly to the wafer, the wafer may suffer damage, such as breakage, or deformation of bonding features, during separation from the carrier. Alternatively, the temporary adhesive may lack sufficient bulk strength and remain on both the active surface of the wafer and on the substrate after separation requiring additional cleaning or etching steps.

Conventional temporary bonding adhesives used in the manufacture of semiconductor devices are either thermoplastic adhesives or crosslinking adhesives. Thermoplastic adhesives have the advantage that residual adhesive can be easily removed by solvent cleaning. A major problem with thermoplastic adhesives is that they become soft when heated which limits their use in certain applications. Crosslinking adhesives are not easily removed by solvent cleaning and are typically removed by peeling either during or after the debonding operation. This peeling step requires the crosslinking adhesives to have some degree of softness at room temperature. Unfortunately, this room temperature softness is problematic as it provides challenges in achieving uniform wafer thicknesses after a grinding operation.

U.S. Pat. App. Pub. No. 2014/0117504 addresses many of the above described problems. This patent application discloses a process for disposing a layer of a temporary bonding composition comprising a curable adhesive material and a release additive between the active (device) side of a semiconductor wafer and the attachment surface of a carrier substrate; followed by curing the adhesive material to provide a temporary bonding layer disposed between the active side of the semiconductor wafer and the attachment surface of the carrier substrate; wherein the temporary bonding layer adjacent to the attachment surface of the carrier substrate comprises a relatively lower amount of the release additive and the temporary bonding layer adjacent to the active side of the semiconductor wafer comprises a relatively higher amount of the release additive. Upon curing of the adhesive material, the release additive phase-separates toward the active surface of the semiconductor wafer, enabling low-force mechanical debonding at room temperature. While this process works on all surfaces found on a semiconductor wafer, copper surfaces must first be plasma treated before coming in contact with the temporary bonding composition, and then the temporary bonding composition must be cured at temperatures above 250° C., in order to provide the desired low-force mechanical debonding from the copper surfaces.

As copper is one of the most common surfaces on semiconductor substrates, there is a need for a temporary bonding composition and process that provides low-force mechanical debonding from a semiconductor substrate having a copper surface, particularly copper interconnect structures, without the need for first plasma treating the copper surface.

The present invention provides a temporary bonding composition comprising: a curable adhesive material, a release additive, and a copper passivation agent. This temporary bonding composition may be a solution, an emulsion, a dispersion, or a dry film, preferably the composition is a solution or a dry film, and more preferably a solution. The release additive is non-curable under the conditions employed to cure the adhesive material. The release additive is selected such that it is soluble or dispersible in the uncured adhesive material, but phase separates during curing of the adhesive material. The copper passivation agent is non-curable under the conditions employed to cure the adhesive material.

The present invention further provides a method of releasably attaching a semiconductor substrate to a carrier substrate comprising: (a) providing a semiconductor substrate having a front side and a back side, the front side having a copper surface; (b) providing a carrier substrate having an attachment surface; (c) disposing a temporary bonding composition comprising a curable adhesive material, a release additive and a copper passivation agent between the front side of the semiconductor substrate and the attachment surface of the carrier substrate; and (d) curing the adhesive material to provide a temporary bonding layer disposed between the front side of the semiconductor substrate and the attachment surface of the carrier substrate; wherein the temporary bonding layer adjacent to the attachment surface of the carrier substrate comprises a relatively lower amount of the release additive and the temporary bonding layer adjacent to the front side of the semiconductor substrate comprises a relatively higher amount of the release additive.

Also provided by the present invention is a structure comprising: a semiconductor substrate having a front side and a back side, the front side having a copper surface; a carrier substrate having an attachment surface; and a temporary bonding layer disposed between the front side of the semiconductor substrate and the attachment surface of the carrier substrate; wherein the temporary bonding layer comprises a cured adhesive material, a copper passivation agent, and a release additive; wherein the temporary bonding layer adjacent to the attachment surface of the carrier substrate comprises a relatively lower amount of the release additive and the temporary bonding layer adjacent to the front side of the semiconductor substrate comprises a relatively higher amount of the release additive.

It has been surprisingly found that the present invention addresses one or more of the deficiencies in conventional temporary bonding approaches used in the semiconductor industry. The present invention is effective in temporarily bonding a semiconductor substrate to a carrier during certain processing steps. The semiconductor substrate is then debonded from the carrier with reduced, preferably no, deformation of features, and reduced, preferably no, residual adhesive remaining on the active side of the wafer as compared to conventional temporary bonding adhesives. The present invention is particularly suitable for use in the processing of semiconductor substrates having a copper surface, or in any other application where a temporary bond to a copper surface is required.

Figure 1A:
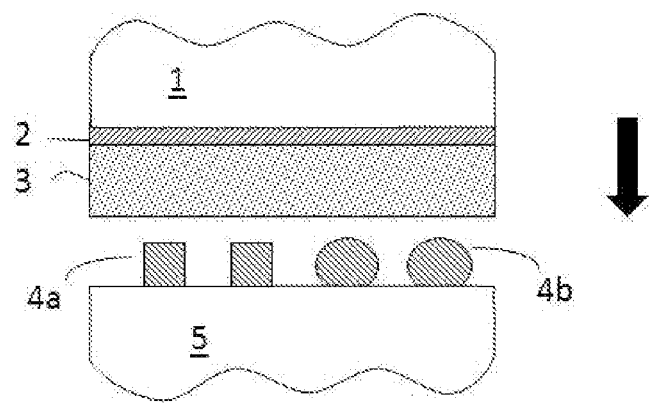
FIGS. 1A-1C are schematic diagrams illustrating the process of the invention.

In the figures, like numerals refer to like elements. It will be understood that when an element is referred to as being "adjacent to" another element, it can be directly adjacent to the other element or intervening elements may be present therebetween. When an element is referred to as being "directly adjacent to" another element, there are no intervening elements.

It will be understood that although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the present invention.

As used throughout this specification, the following abbreviations shall have the following meanings, unless the context clearly indicates otherwise: ° C.=degree Celsius; g=gram; mg=milligram; L=liter; ppm=part per million; μm=micron=micrometer; nm=nanometer; mm=millimeter; mL=milliliter; kPa=kilopascal; GPa=gigapascal; and Mn=number average molecular weight in Da. All amounts are percent by weight and all ratios are molar ratios, unless otherwise noted. All numerical ranges are inclusive and combinable in any order, except where it is clear that such numerical ranges are constrained to add up to 100%. "Wt %" refers to percent by weight, based on the total weight of a referenced composition, unless otherwise noted.

As used throughout the specification, "feature" refers to the geometries on a substrate, and particularly on a semiconductive wafer. The term "alkyl" includes linear, branched and cyclic alkyl. Likewise, "alkenyl" refers to linear, branched and cyclic alkenyl. "Aryl" refers to aromatic carbocycles and aromatic heterocycles. "(Meth)acrylic" refers to both "acrylic" and "methacrylic". By the term "curing" is meant any process, such as polymerization or condensation, that increases the molecular weight of a material or composition. "Curable" refers to any material capable of being cured (such as polymerized) under certain conditions. The term "oligomer" refers to dimers, trimers, tetramers and other relatively low molecular weight materials that are capable of further curing. The articles "a", "an" and "the" refer to the singular and the plural. The term "and/or" includes any one of or any combination of the associated listed items.

It has been found that an adhesive composition comprising a curable adhesive material, a release additive and a copper passivation agent may be used to form an ephemeral (or temporary) bonding layer. In use, the present adhesive composition is first disposed between a carrier substrate surface and a surface of a component having a copper surface, the composition is then cured, and various operations may then be performed on the component, after which the component is separated from the carrier.

In particular, the present invention provides a method of releasably attaching a semiconductor substrate to a carrier substrate comprising: (a) providing a semiconductor substrate having a front side and a back side, the front side having a copper surface; (b) providing a carrier substrate having an attachment surface; (c) disposing a temporary bonding composition comprising a curable adhesive material, a release additive and a copper passivation agent between the front side of the semiconductor substrate and the attachment surface of the carrier substrate; and (d) curing the adhesive material to provide a temporary bonding layer disposed between the front side of the semiconductor substrate and the attachment surface of the carrier substrate; wherein the temporary bonding layer adjacent to the attachment surface of the carrier substrate comprises a relatively lower amount of the release additive and the temporary bonding layer adjacent to the front side of the semiconductor substrate comprises a relatively higher amount of the release additive.

As used herein, the term "semiconductor substrate" means any construction comprising semiconductive material, including but not limited to bulk semiconductive material such as a semiconductor wafer, either alone or in assemblies comprising other materials thereon, and semiconductor material layers, either alone or on or in assemblies comprising other materials. A semiconductor device refers to a semiconductor substrate upon which at least one active or operable semiconductor device has been, is being, or will be fabricated. A wide variety of semiconductor substrates may be employed in the present invention. Semiconductor substrates encompass "electronic device substrates," "semiconductor devices," and various packages for various levels of interconnection, and may be in the form of a wafer or a panel. Semiconductor substrates include single-chip wafer, multiple-chip wafer, packages for various levels, substrates for light emitting diodes, or other assemblies requiring solder connections. Particularly suitable semiconductor substrates are formed from glass, sapphire, silicate materials, silicon nitride materials, silicon carbide materials, and patterned wafers, such as patterned silicon wafers, patterned gallium-arsenide wafers, and epoxy mold compound wafers. Such wafers may be any suitable size, such as those having diameters of 200 mm to 300 mm, although wafers having smaller or larger dimensions may be used.

The front (or device) side of a semiconductor substrate typically contains active devices. An "active" device is any type of circuit component with the ability to electrically control electron flow, such as, for example, transistors. The front side of semiconductor substrates useful in the present invention have one or more copper surfaces, which includes copper alloy surfaces. Suitable copper alloys include copper-tin, copper-tin-silver, copper-beryllium, copper-nickel, and the like. Such copper surfaces may also be part of a metal stack, such as a copper layer having a nickel underlayer or a nickel cap layer. Such copper surfaces are typically in the form of interconnect structures may have any suitable form such as copper bond pads, copper pillars, copper solder balls, and the like. It will be appreciated by those skilled in the art that the front side of a semiconductor substrate have only one type of copper surface, such as a single type of copper interconnect structure, or more than one type of copper surface, such as any combination of copper interconnect features. The front side of a semiconductor substrate, such as a semiconductor wafer, may also include other interconnect features, such as metal bond pads, solder bumps (or solder balls), metal pillars, and the like, that are not copper surfaces. Also, the front side of suitable semiconductor substrates typically have certain passivation layers such as metal oxides, metal nitrides, polymers such as polyimide, and the like. Metal bond pads typically comprise one or more metals chosen from copper, tin, gold, silver, aluminum, and alloys thereof, although other metals may be used. Exemplary solder bumps typically comprise one or more of tin, copper, silver, gold, lead, indium, and bismuth, preferably tin, copper, silver, gold, and lead, and more preferably tin, copper, silver, gold, tin-lead, tin-silver, tin-zinc, tin-bismuth, and tin-silver-copper. Metal pillars typically comprise copper, often capped with one or more other metals, such as silver, tin-silver, tin-bismuth, tin-indium, indium, or nickel. Preferably, the active surface of the semiconductor substrate is relatively hydrophilic as compared to the attachment surface of the carrier substrate. The hydrophilicity of the active surface may be increased by liquid or plasma treatment of the wafer surface to remove surface impurities such as adventitious carbon.

Any suitable carrier may be used as the carrier substrate. Exemplary carrier substrates include, without limitation, wafers, glass such as borosilicate, quartz, silica, and thermally stable polymers. Wafers used as carriers may be composed of silicon, silicon carbide, silicon germanium, silicon nitride, gallium arsenide, sapphire, and the like. Thermally stable polymers include, without limitation, any polymer stable to the temperatures used to cure the adhesive material, such as polyimide (for example, KAPTON™ polyimide, available from DuPont, Wilmington, Del.). Preferably, the attachment surface of the carrier substrate is relatively hydrophobic as compared to the active surface of the semiconductor wafer. If the attachment surface of the carrier substrate is insufficiently hydrophobic, the desired hydrophobicity may be imparted by any number of ways known in the art such as by contacting the attachment surface with a suitable adhesion promoter or by vapor treating the attachment surface. The attachment surface may be contacted with an adhesion promoter using any suitable method, such as spin-coating, dip coating, spray coating, curtain coating, roll coating, vapor deposition, and the like, and preferably by spin-coating. Various vapor treatments may be used to increase the hydrophobicity of the attachment surface, such as plasma treatments. Preferably, an adhesion promoter is used to treat the attachment surface to impart the desired hydrophobicity. Any suitable adhesion promoter may be used and the selection of such adhesion promoter is well within the ability of those skilled in the art. Preferred adhesion promoters are silane-containing materials, and more preferably trialkoxysilane-containing materials. Exemplary adhesion promoters include, but are not limited to: bis(trialkoxysilylalkyl)benzenes such as bis(t-rimethoxysilylethyl)benzene; aminoalkyl trialkoxy silanes such as aminopropyl trimethoxy silane, aminopropyl triethoxy silane, bis[3-(trimethoxysilyl)propyl]amine, bis[3-(triethoxysilyl)propyl]amine, N-(2-aminoethyl)-3-aminopropyltrimethoxysilane and N-(2-aminoethyl)-3-aminopropyltriethoxysilane, and phenyl aminopropyl triethoxy silane; and other silane coupling agents, as well as mixtures of the foregoing. Particularly suitable adhesion promoters include AP 3000, AP 8000, and AP 9000S, available from Dow Electronic Materials (Marlborough, Mass.).

The present temporary bonding compositions comprise a curable adhesive material, a release additive, a copper passivation agent, and one or more optional components. Typically, the curable adhesive material has a modulus of >1 GPa when cured. Exemplary curable adhesive materials include, without limitation, polyarylene oligomers, cyclic-olefin oligomers, arylcyclobutene oligomers, vinyl aromatic oligomers, and mixtures thereof. The curable adhesive material may be substituted with any suitable moiety to provide additional hydrophobicity, such as fluorine-containing groups, as long as such moieties do not adversely impact the mechanical properties of the cured adhesive material. Preferably, the curable adhesive material is chosen from one or more arylcyclobutene oligomers, vinyl aromatic oligomers or mixtures thereof. When a mixture of different curable adhesive materials is used in the present invention, such materials are selected such that they cure with each other during the curing step. When a mixture of different curable materials are used, such curable materials are used in a weight ratio of 99:1 to 1:99, preferably from 95:5 to 5:95, more preferably from 90:10 to 10:90, and still more preferably from 75:25 to 25:75.

A wide variety of polyarylene oligomers may be used in the present invention. As used herein, the term "polyarylenes" includes polyarylene ethers. Suitable polyarylene oligomers may be synthesized from precursors such as ethynyl aromatic compounds of the formula:

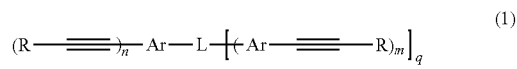

wherein each Ar is an aromatic group or inertly-substituted aromatic group; each R is independently hydrogen, an alkyl, aryl or inertly-substituted alkyl or aryl group; L is a covalent bond or a group which links one Ar to at least one other Ar; n and m are integers of at least 2; and q is an integer of at least 1. As such, the ethynyl aromatic compounds typically have four or more ethynyl groups (for example, tetraethynyl aromatic compounds).

Suitable polyarylene oligomers used in the temporary bonding compositions may comprise a polymer comprising as polymerized units:

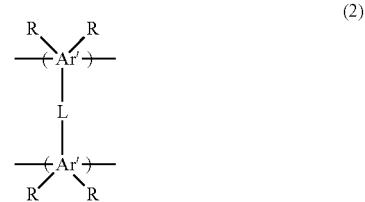

wherein Ar' is the residual of the reaction of product of (C≡C)$_n$—Ar or Ar—(C≡C)$_m$ moieties and R, L, n and m are as defined above. Polyarylene copolymers useful in the invention include as polymerized units a monomer having the formula:

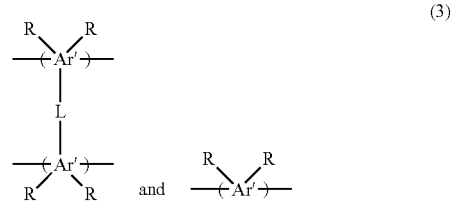

wherein Ar' and R are as defined above.

Exemplary polyarylenes include, but are not limited to, those wherein Ar-L-Ar is: biphenyl; 2,2-diphenyl propane; 9,9'-diphenyl fluorene; 2,2-diphenyl hexafluoro propane; diphenyl sulfide; oxydiphenylene; diphenyl ether; bis(phenylene)diphenylsilane; bis(phenylene) phosphine oxide; bis(phenylene)benzene; bis(phenylene)naphthalene; bis(phenylene)anthracene; thiodiphenylene; 1,1,1-triphenyleneethane; 1,3,5-triphenylenebenzene; 1,3,5-(2-phenylene-2-propyl)benzene; 1,1,1-triphenylenemethane; 1,1,2,2-tetraphenylene-1,2-diphenylethane; bis(1,1-diphenyleneethyl)benzene; 2,2'-diphenylene-1,1,1,3,3,3-hexafluoropropane; 1,1-diphenylene-1-phenylethane; naphthalene; anthracene; or bis(phenylene)napthacene; more preferably biphenylene; naphthylene; p,p'-(2,2-diphenylene propane) (or —$C_6H_4$—$C(CH_3)_2$—$C_6H_4$—); p,p'-(2,2-diphenylene-1,1,1,3,3,3hexafluoropropene) and (—$C_6H_4$—$C(CF_3)_2$—$C_6H_4$—). Useful bis-phenyl derivatives include 2,2-diphenyl propane; 9,9'-diphenyl fluorene; 2,2-diphenyl hexafluoro propane; diphenyl sulfide; diphenyl ether; bis(phenylene)diphenylsilane; bis(phenylene)phosphine oxide; bis(phenylene)benzene; bis(phenylene)naphthalene; bis(phenylene)anthracene; or bis(phenylene)napthacene. Particularly suitable polyarylenes for use in the present invention include those sold as SiLK™ Semiconductor Dielectric (available from Dow Electronic Materials, Marlborough, Mass.).

The polyarylene precursor monomers may be prepared by a variety of methods known in the art, such as described in Int. Pat. App. No. WO 97/10193 (Babb). The ethynyl aromatic monomers of Formula (1) are useful to prepare polymers of either Formula (2) or (3). Polymerization of the ethynyl aromatic monomers is well within the ability of one skilled in the art. While the specific conditions of polymerization are dependent on a variety of factors including the specific ethynyl aromatic monomer(s) being polymerized and the desired properties of the resulting polymer, the general conditions of polymerization are detailed in Int. Pat. App. No. WO 97/10193.

Suitable cyclic-olefin materials are poly(cyclic-olefins), which may be thermoplastic, and preferably have a weight average molecular weight ($M_w$) of from 2000 to 200,000, more preferably from 5000 to 100,000, and even more preferably from 2000 to 50,000 Da. Preferred poly(cyclic-olefins) have a softening temperature (melt viscosity at 3,000 PaS) of at least 100° C., and more preferably at least 140° C. Suitable poly(cyclic-olefins) also preferably have a glass transition temperature ($T_g$) of at least 60° C., more preferably from 60 to 200° C., and most preferably from 75 to 160° C.

Preferred poly(cyclic-olefins) are comprised of recurring monomers of cyclic-olefins and acyclic olefins, or ring-opening polymers based on cyclic-olefins. Suitable cyclic olefins for use in the present invention are chosen from norbornene-based olefins, tetracyclododecene-based olefins, dicyclopentadiene-based olefins, and derivatives thereof. Derivatives include alkyl (preferably $C_{1-20}$ alkyls, more preferably $C_{1-10}$ alkyls), alkylidene (preferably $C_{1-20}$ alkylidenes, more preferably $C_{1-10}$ alkylidenes), aralkyl (preferably $C_{6-30}$ aralkyls, more preferably $C_{6-18}$ aralkyls), cycloalkyl (preferably $C_{3-30}$ cycloalkyls, more preferably $C_{3-18}$ cycloalkyls), ether, acetyl, aromatic, ester, hydroxy, alkoxy, cyano, amide, imide, and silyl-substituted derivatives. Particularly preferred cyclic-olefins for use in the present invention include those chosen from

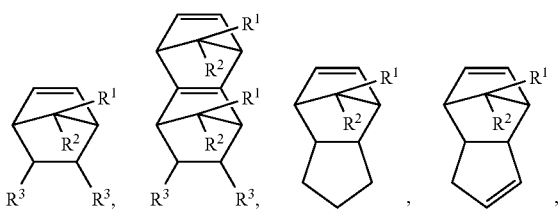

-continued

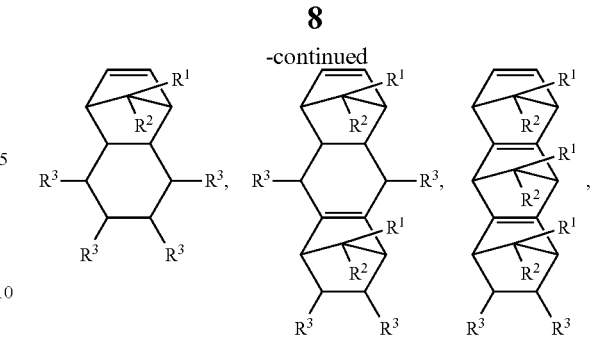

and combinations of the foregoing, where each $R^1$ and $R^2$ is independently chosen from H, and alkyl groups (preferably $C_{1-20}$ alkyls), and each $R^3$ is independently chosen from H, substituted and unsubstituted aryl groups (preferably $C_{6-18}$ aryls), alkyl groups (preferably $C_{1-20}$ alkyls), cycloalkyl groups (preferably $C_{3-30}$ cycloalkyl groups), aralkyl groups (preferably $C_{6-30}$ aralkyls such as benzyl, phenethyl, phenylpropyl, and the like), ester groups, ether groups, acetyl groups, alcohols (preferably $C_{1-10}$ alcohols), aldehyde groups, ketones, nitriles, and combinations thereof.

Preferred acyclic olefins are chosen from branched and unbranched $C_{2-20}$ alkenes (preferably $C_{2-10}$ alkenes). More preferably, the acyclic olefins have the structure $(R^4)_2C=C(R^4)_2$, where each $R^4$ is independently chosen from H and alkyl groups (preferably $C_{1-20}$ alkyls). Particularly preferred acyclic olefins for use in the present invention include those chosen from ethene, propene, and butene.

Cyclic-olefin copolymers are well-known in the art. For example, cyclic-olefin copolymers can be produced by chain polymerization of a cyclic monomer with an acyclic monomer, such as disclosed in U.S. Pat. No. 6,008,298. Cyclic-olefin copolymers can also be produced by ring-opening metathesis polymerization of various cyclic monomers followed by hydrogenation, such as disclosed in U.S. Pat. No. 5,191,026. Suitable cyclic-olefin copolymers include those available under the TOPAS™ (produced by Topas Advanced Polymers), APEL™ (produced by Mitsui Chemicals), ZEONOR™ (from Zeon Chemicals) and ARTON™ (from JSR Corporation) brands.

Arylcyclobutene oligomers useful as the present curable adhesive materials are well-known in the art. Suitable arylcyclobutene oligomers include, but are not limited to, those having the formula:

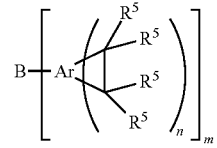

wherein B is an n-valent linking group; Ar is a polyvalent aryl group and the carbon atoms of the cyclobutene ring are bonded to adjacent carbon atoms on the same aromatic ring of Ar; m is an integer of 1 or more; n is an integer of 1 or more; and $R^5$ is a monovalent group. Preferably, the polyvalent aryl group, Ar, may be composed of 1-3 aromatic carbocyclic or heteroaromatic rings. It is preferred that the aryl group comprise a single aromatic ring, and more preferably a phenyl ring. The aryl group is optionally substituted with 1 to 3 groups chosen from $C_{1-6}$ alkyl, tri-$C_{1-6}$-alkylsilyl, $C_{1-6}$ alkoxy, and halo, preferably with one or more of $C_{1-6}$ alkyl, tri-$C_{1-3}$-alkylsilyl, $C_{1-3}$ alkoxy, and chloro, and more preferably with one or more of $C_{1-3}$ alkyl, tri-$C_{1-3}$-alkylsilyl, and $C_{1-3}$ alkoxy. It is preferred that the aryl group is unsubstituted. It is preferred that n=1 or 2, and more preferably n=1. It is preferred that m=1-4, more preferably m=2-4, and yet more preferably m=2. Preferably, $R^5$ is chosen from H and $C_{1-6}$ alkyl, and more preferably from H and $C_{1-3}$ alkyl. Preferably, B comprises one or more carbon-carbon double bonds (ethylenic unsaturation). Suitable single valent B groups preferably have the formula —[C($R^{10}$)=C$R^{11}$]$_x$Z, wherein $R^{10}$ and $R^{11}$ are independently chosen from hydrogen, $C_{1-6}$ alkyl, and aryl; Z is chosen from hydrogen, $C_{1-6}$ alkyl, aryl, siloxanyl, —CO$_2R^{12}$; each $R^{12}$ is independently chosen from H, $C_{1-6}$ alkyl, aryl, aralkyl, and alkaryl; and x=1 or 2. Preferably, $R^{10}$ and $R^{11}$ are independently chosen from H, $C_{1-3}$ alkyl, and aryl, and more preferably H and $C_{1-3}$ alkyl. It is preferred that $R^{12}$ is $C_{1-3}$ alkyl, aryl, and aralkyl. Z is preferably siloxyl. Preferred siloxyl groups have the formula —[Si($R^{13}$)$_2$—O]$_p$—Si($R^{13}$)$_2$—, wherein each $R^{13}$ is independently chosen from H, $C_{1-6}$ alkyl, aryl, aralkyl, and alkaryl; and p is an integer from 1 or more. It is preferred that $R^{13}$ is chosen from $C_{1-3}$ alkyl, aryl, and aralkyl. Suitable aralkyl groups include benzyl, phenethyl and phenylpropyl.

Preferably, the arylcyclobutene oligomers comprise one or more oligomers of the formula:

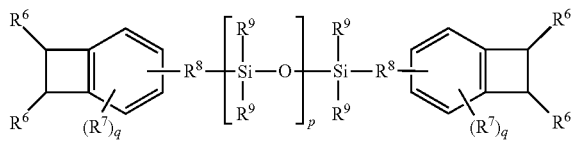

wherein each $R^6$ is independently chosen from H and $C_{1-6}$ alkyl, and preferably from H and $C_{1-3}$ alkyl; each $R^7$ is independently chosen from $C_{1-6}$ alkyl, tri-$C_{1-6}$-alkylsilyl, $C_{1-6}$ alkoxy, and halo; each $R^8$ is independently a divalent, ethylenically unsaturated organic group; each $R^9$ is independently chosen from H, $C_{1-6}$ alkyl, aralkyl and phenyl; p is an integer from 1 or more; and q is an integer from 0-3. Each $R^6$ is preferably independently chosen from H and $C_{1-3}$ alkyl, and more preferably each $R^6$ is H. It is preferred that each $R^7$ is independently chosen from $C_{1-6}$ alkyl, tri-$C_{1-3}$-alkylsilyl, $C_{1-3}$ alkoxy, and chloro, and more preferably from $C_{1-3}$ alkyl, tri-$C_{13}$-alkylsilyl, and $C_{1-3}$ alkoxy. Preferably, each $R^8$ is independently chosen from a $C_{2-6}$ alkenyl, and more preferably each $R^8$ is —CH=CH—. Each $R^9$ is preferably chosen from $C_{1-3}$ alkyl, and more preferably each $R^9$ is methyl. Preferably, p=1-5, more preferably p=1-3, and yet more preferably p=1. It is preferred that q=0. A particularly preferred arylcyclobutene oligomer, 1,3-bis(2-bicyclo[4.2.0] octa-1,3,5-trien-3-yl ethenyl)-1,1,3,3 tetramethyldisiloxane ("DVS-bisBCB"), has the formula

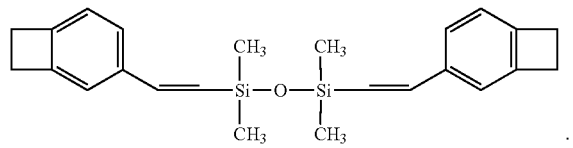 [SMILES: C[Si](C)(C=Cc1ccc2c(c1)CC2)O[Si](C)(C)C=Cc1ccc2c(c1)CC2]

Arylcyclobutene oligomers may be prepared by any suitable means, such as those described in U.S. Pat. Nos. 4,812,588; 5,136,069; 5,138,081; and Int. Pat. App. No. WO 94/25903. Suitable arylcyclobutene oligomers are also commercially available under the CYCLOTENE™ brand, available from Dow Electronic Materials.

Any vinyl aromatic oligomers capable of being cured may be used as the curable adhesive materials in the present. Such vinyl aromatic oligomers are typically oligomers of a vinyl aromatic monomer with one or more reactive ethylenically unsaturated co-monomers. Preferably, the vinyl aromatic monomers contain one vinyl group. Suitable vinyl aromatic monomers are unsubstituted vinyl aromatic monomers and substituted vinyl aromatic monomers where one or more hydrogens are replaced with a substituent group selected from the group of $C_{1-6}$ alkyl, $C_{1-6}$ alkoxy, halo, and amino. Exemplary vinyl aromatic monomers include, without limitation, styrene, vinyltoluene, vinylxylene, vinylanisole, vinyldimethoxybenzene, vinylaniline, halostyrene such as fluorostyrene, α-methylstyrene, β-methoxystyrene, ethylvinylbenzene, vinylpyridines, vinylimidazoles, vinylpyrroles, and mixtures thereof. Preferred vinyl aromatic monomers are styrene, vinyltoluene, vinylxylene, vinylanisole, ethylvinylbenzene, and mixtures thereof. Preferred reactive co-monomers are those comprising a reactive moiety, that is, a moiety capable of further polymerization (or crosslinking) following formation of the vinyl aromatic oligomer, such as an allyl moiety or a vinyl group, in addition to an olefinic (or ethylenically unsaturated) moiety used to form the vinyl aromatic oligomer. More preferably, the reactive co-monomers comprise an allyl moiety in addition to the ethylenic unsaturation used to form the vinyl aromatic oligomer, and even more preferably comprise an allyl ester moiety in addition to the ethylenic unsaturation. Exemplary reactive co-monomers useful in forming the vinyl aromatic oligomers include, but are not limited to, diallyl maleate, allyl acrylate, allyl methacrylate, allyl cinnamate, diallyl fumarate, allyl tiglate, divinylbenzene, and mixtures thereof. Preferred reactive co-monomers are diallyl maleate, allyl acrylate, allyl methacrylate and mixtures thereof, and more preferably diallyl maleate, allyl methacrylate and mixtures thereof. It will be appreciated by those skilled in the art that one or more secondary co-monomers may also be used to form the vinyl aromatic oligomers. Such secondary co-monomers are ethylenically unsaturated, but do not contain a reactive moiety. Exemplary secondary co-monomers include, but are not limited to, (meth)acrylic acid, (meth) acrylamides, $C_{1-10}$ alkyl (meth)acrylates, aromatic (meth) acrylates, substituted ethylene monomers, and poly(alkylene oxide) monomers.

The molar ratio of vinyl aromatic monomers to co-monomers in such vinyl aromatic oligomers is preferably from 99:1 to 1:99, more preferably from 95:5 to 5:95, and still more preferably from 90:10 to 10:90. Such vinyl aromatic oligomers may be prepared by any suitable method, such as any of those known in the art. Typically, vinyl aromatic oligomers are prepared by free-radical polymerization of a vinyl aromatic monomer and a co-monomer. Preferred vinyl aromatic oligomers comprise unreacted allyl moieties that allow such oligomers to further cure.

A wide variety of materials may be used as the release additives in the temporary bonding compositions provided that such materials do not react with the adhesive material under conditions of storage and use, and are non-curable under the conditions used to cure the adhesive material. In addition, the release additives should be compatible with the temporary bonding composition, that is, the release additives must be dispersible, miscible or otherwise substantially compatible with the adhesive material, and any other components, such as organic solvents, used in the temporary bonding composition. The present release additives are sufficiently non-volatile such that they do not substantially evaporate under the conditions of use, that is, they substantially do not evaporate during any deposition step, such as spin-coating, or any subsequent heating step used to remove any organic solvent or to cure the adhesive material. When a film or layer of the temporary bonding composition is cast, such as by spin-coating, much (or all) of the solvent evaporates. It is preferred that the release additive is soluble in any organic solvent used, but is not completely soluble in the curable adhesive material. The release additives are preferentially more hydrophilic than the cured adhesive material. Not being bound by theory, it is believed that upon curing of the adhesive material, the release additive phase separates and migrates preferentially toward the active surface of the semiconductor substrate (the more hydrophilic surface as compared to the carrier surface). The use of appropriate hydrophilic moieties in the release additives allow for complete dispersion, or preferably dissolution, of the release additive in the temporary bonding composition, and phase separation of the release additive during curing of the adhesive material with migration of the release additive toward the more hydrophilic surface. Any material which does not phase separate from the adhesive material during curing will not function as a release additive according to the present invention. Mixtures or release additives my be used.

In general, the release additives will contain one or more relatively hydrophilic moieties, such as moieties containing one or more of oxygen, nitrogen, phosphorus, and sulfur. Suitable release additives include, without limitation: ethers, esters, carboxylates, alcohols, thioethers, thiols, amines, imines, amides, and mixtures thereof. Preferably, the release additives contain one or more polar end groups, which contain one or more of oxygen, nitrogen and sulfur, and preferably oxygen. Exemplary polar end groups include: alkoxy, aryloxy, hydroxy, carboxylate, alkoxycarbonyl, mercapto, alkylthio, primary amine, secondary amine, and tertiary amine; preferably the end groups are chosen from $C_{1-6}$ alkoxy, $C_{6-10}$ aryloxy, hydroxy, carboxylate, $C_{1-6}$ alkoxycarbonyl, mercapto, $C_{1-6}$ alkylthio, amino, $C_{1-6}$ alkylamino, and di-$C_{1-6}$-alkylamino; more preferably from $C_{1-6}$ alkoxy, $C_{6-10}$ aryloxy, hydroxy, carboxylate, and $C_{1-6}$ alkoxycarbonyl; and even more preferably from $C_{1-6}$ alkoxy, hydroxy, carboxylate, and $C_{1-6}$ alkoxycarbonyl. Particularly preferred polar end groups are chosen from hydroxy, methoxy, ethoxy, propoxy, butoxy, carboxyl, and acetoxy. Preferably, the release additives are free of silicon.

Suitable release additives have a number average molecular weight ($M_n$) of $\leq 10,000$ Da, preferably $\leq 7500$, and more preferably $\leq 7000$. The release additives have a minimum $M_n$ sufficient to render the release additives substantially non-volatile during conditions of use, that is, <5%, preferably <3%, and more preferably $\leq 1\%$ of the release additive is volatilized during use. Preferably, the release additives have a $M_n$ of $\geq 500$. A preferred range of $M_n$ is from 500 to 10,000, more preferably from 500 to 7500, and yet more preferably from 500 to 7000 Da. While the release additives may be linear polymers; branched polymers such as dendritic polymers, star polymers and the like; polymer particles; and the like, it is preferred that the release additives are linear polymers or polymer particles, and more preferably linear polymers. While not being bound by theory, it is believed that linear polymers are better able to migrate through the curing adhesive material phase toward the hydrophilic semiconductor surface surface as compared to branched polymers.

Polyethers and polyetheramines are the preferred release additives, and more preferably a mixture of a polyether and a polyetheramine is used. Polyether compounds include alkyleneoxide homopolymers, alkyleneoxide copolymers, and mixtures thereof. Polyalkyleneoxide copolymers may be random or block. Polyalkylene oxide release additives may have a variety of polar end groups, preferably such polar end groups are hydroxy, $C_{1-6}$ alkoxy, $C_{1-6}$ alkoxycarbonyl, and amino, and more preferably hydroxy, $C_{1-3}$ alkoxy, and acetoxy. Preferred polyether compounds are polyglycols (or polyalkylene oxides), such as poly $C_{1-4}$ alkylene oxide compounds, which may comprise a single alkylene oxide repeating unit, or two or more different alkylene oxide repeating units. Preferred polyether and polyetheramine compounds include polyethylene glycol, polypropylene glycol, poly(1,3-propanediol), poly(tetrahydrofuran), ethylene oxide (EO)-propylene oxide (PO) copolymers, EO-butylene oxide (BO) copolymers, amine terminated polypropylene oxide, and mixtures thereof. Other suitable release additives include polyalkylene oxide functionalized polyamines, such as EO/PO tetrafunctionalized ethylenediamine. Preferably, when the release additive comprises butylene oxide as a repeating unit, it is a copolymer with one or more different alkylene oxide repeating units. It will be appreciated by those skilled in the art that mixtures of release additives may be used in the present temporary bonding compositions. Suitable release additives include polyethers sold under the PLURONIC, TETRONIC and POLYTHF product names (available from BASF, Ludwigshafen, Germany), the FORTEGRA product name (available from The Dow Chemical Company, Midland Mich.), the TERATHANE product name (available from Invista, Wichita, Kans.), and the JEFFAMINE polyetheramines (available from Huntsman Corp.), all of which may be used without further purification.

As used throughout this specification, the phrase "copper passivation agent" refers to any material which is capable of coating the surface of a copper layer so as to protect or passivate the copper surface. While not wishing to be bound by theory, it is believed that the copper passivation agent may complex, adsorb, chemisorb, coordinate, chelate, binding, or otherwise sufficiently adhere to the copper surface to reduce interactions between the copper surface and the cured adhesive material. As used herein, "coating" of the copper passivation agent on the copper surface encompasses one or more of the following: complexing, adsorbing, chemisorbing, coordinating, chelating, binding or otherwise adhering. The present temporary bonding compositions more easily release from such a passivated copper surface, as compared to a non-passivated copper surface. The copper passivation agents useful in the present invention are soluble or miscible in the temporary bonding compositions. These copper passivation agents do not react with the adhesive material under conditions of storage and use, and do not cure under the conditions employed to cure the adhesive material. The present copper passivation agents are sufficiently non-volatile such that they do not substantially evaporate under the conditions of use, that is, they do not substantially evaporate during any deposition step, such as spin-coating, or any subsequent heating step used to remove any organic solvent or to cure the adhesive material. That is, $\leq 10\%$, preferably $\leq 5\%$, and more preferably $\leq 2\%$ of the copper passivation agent evaporates under the conditions of use. The copper passivation agent may remain dissolved or dispersed in the adhesive material following removal of any solvent. While not wishing to be bound by theory, it is believed that under the conditions of use the copper passivation agent coats the copper surface of a semiconductor wafer or other substrate.

Such coating of the copper passivation agent on the copper surface occurs prior to and/or during curing of the adhesive material.

Any copper passivation agent may suitably be used in the present invention, provided such copper passivation agent is soluble or miscible in the temporary bonding composition and provides for release of the temporary bonding layer from copper surfaces. Suitable copper passivation agents include copper corrosion inhibitors, organic solderability preservatives, and the like. Copper passivation agents are preferably nitrogen-containing hydrocarbyl compounds, which may optionally contain one or more atoms chosen from oxygen, sulfur, and halogen. Preferred copper passivation agents are nitrogen-containing aromatic compounds, more preferably nitrogen-containing heteroaromatic compounds, and even more preferably nitrogen-containing fused aromatic compounds, such as aromatic compounds having a phenyl ring fused to a nitrogen-containing heterocyclic ring. Particularly preferred copper passivation agents are substituted nitrogen-containing heteroaromatic compounds having one or more hydrogens on an aromatic ring replaced with one or more substituents chosen from $C_{1-10}$ alkyl, $C_{6-10}$ aryl, $C_{7-20}$ aralkyl, $C_{2-10}$ alkenyl, $C_{1-10}$ alkoxy, carboxy, $C_{1-10}$ alkoxycarbonyl, carb-$C_{1-10}$-alkoxy, sulfoxy, hydroxy, thiol, $C_{1-10}$ alkylmercaptan, $C_{6-10}$ arylmercaptan, amino, $C_{1-10}$ alkyl amino, di-$C_{1-10}$-alkylamino, $C_{6-10}$ aryl amino, di-$C_{6-10}$-arylamino, $C_{1-10}$ amido, $C_{2-50}$ alkylamido, $C_{3-50}$ dialkylamido, and halogen. More preferably, the copper passivation agents are substituted pyrazoles, substituted imidazoles, substituted triazoles, substituted tetrazoles, substituted pyrazines, substituted benzimidazoles, substituted benzotriazoles, substituted benzotetrazoles, and substituted pyrazinimidazoles, even more preferably from substituted imidazoles, substituted triazoles, substituted tetrazoles, substituted benzimidazoles, substituted benzotriazoles, and substituted benzotetrazoles, yet more preferably from substituted triazoles, substituted tetrazoles, substituted benzimidazoles, substituted benzotriazoles, and substituted benzotetrazoles, and still more preferably from substituted benzimidazoles and substituted benzotriazoles. It is preferred that the copper passivation agent is substituted with one or more of $C_{1-10}$ alkyl, $C_{6-10}$ aryl, $C_{7-20}$ aralkyl, $C_{1-10}$ alkoxy, carboxy, $C_{1-10}$ alkoxycarbonyl, carb-$C_{1-10}$-alkoxy, hydroxy, thiol, $C_{1-10}$ alkylmercaptan, amino, $C_{1-10}$ alkyl amino, di-$C_{1-10}$-alkylamino, $C_{6-10}$ aryl amino, di-$C_{6-10}$-arylamino, $C_{1-10}$ amido, $C_{2-50}$ alkylamido, $C_{3-50}$ dialkylamido, and halogen. Preferred copper passivation agents are $C_{1-10}$ alkylbenzimidazole, aminobenzimidazole, $C_{1-10}$ alkylaminobenzimidazole, di-$C_{1-10}$-alkylbenzimidazole, arylbenzimidazole, carboxybenzimidazole, $C_{1-10}$ alkoxycarbonylbenzimidazole, halobenzimidazole, $C_{1-10}$ alkylbenzotriazole, aminobenzotriazole, $C_{1-10}$ alkylaminobenzotriazole, di-$C_{1-10}$-alkylbenzotriazole, $C_{6-10}$ arylbenzotriazole, carboxybenzotriazole, $C_{1-10}$ alkoxycarbonylbenzotriazole, $C_{1-10}$ amidobenzotriazole, $C_{2-50}$ alkylamidobenzotriazole, $C_{3-50}$ dialkylamidobenzotriazole and halobenzotriazole, more preferably $C_{1-10}$ alkylbenzimidazole, aminobenzimidazole, $C_{1-10}$ alkylaminobenzimidazole, di-$C_{1-10}$-alkylbenzimidazole, $C_{6-10}$ arylbenzimidazole, carboxybenzimidazole, $C_{1-10}$ alkoxycarbonylbenzimidazole, halobenzimidazole, $C_{1-10}$ alkylbenzotriazole, aminobenzotriazole, $C_{1-10}$ alkylaminobenzotriazole, di-$C_{1-10}$-alkylbenzotriazole, $C_{6-10}$ arylbenzotriazole, carboxybenzotriazole, $C_{1-10}$ alkoxycarbonylbenzotriazole, and halobenzotriazole, and even more preferably $C_{1-10}$ alkylbenzotriazole, aminobenzotriazole, $C_{1-10}$ alkylaminobenzotriazole, di-$C_{1-10}$-alkylbenzotriazole, $C_{6-10}$ arylbenzotriazole, carboxybenzotriazole, $C_{1-10}$ alkoxycarbonylbenzotriazole, and halobenzotriazole. Mixtures of copper passivation agents may be employed in the present invention. When a mixture of 2 copper passivation agents is used, they may be used in a weight ratio of from 99:1 to 1:99. It will be appreciated by those skilled in the art that a copper passivation agent having a relatively reactive group, such as carboxy, may react with a release additive having a relatively reactive polar end group, such as hydroxy, amino, mercapto, and the like. Suitable copper passivation agents are well known in the art and are readily commercially available, such as from PMC Specialties Group (Cincinnati, Ohio), Shikoku Chemicals Corp. (Tokyo, Japan), and Sigma-Aldrich (Milwaukee, Wis.), or may be prepared by any suitable method known in the literature.

It is preferred that one or more organic solvents be used in the temporary bonding composition. Any solvent or mixture of solvents that dissolves or disperses, and preferably dissolves, the curable adhesive material, the release additive, and the passivation agent may suitably be used in the temporary bonding compositions. Exemplary organic solvents include, without limitation: aromatic hydrocarbons such as toluene, xylene, and mesitylene; alcohols such as 2-methyl-1-butanol, 4-methyl-2-pentanol, and methyl isobutyl carbinol; esters such as ethyl lactate, propylene glycol methyl ether acetate, and methyl 2-hydroxyisobutyrate; lactones such as gamma-butyrolactone; lactams such as N-methylpyrrolidinone; ethers such as propylene glycol methyl ether and dipropylene glycol dimethyl ether isomers (commercially available from The Dow Chemical Company as PROGLYDE™ DMM); ketones such as cyclohexanone and methylcyclohexanone; and mixtures thereof.

The present temporary bonding compositions may optionally include one or more additional components, such as compatibilizers, curing agents, antioxidants, thickening agents, and the like. The selection of such optional additional components and the amounts used are well within the ability of those skilled in the art. The term "compatibilizer" refers to any material which is miscible in (dissolves) or disperses in the adhesive material, provided that such compatibilizer does not react with the adhesive material under conditions of storage and use, does not cure under the conditions employed to cure the adhesive material, and increases the amount of the release additive that can be dissolved or dispersed in the adhesive material as compared to when no compatibilizer is used. Suitable compatibilizers are disclosed in U.S. patent application Ser. No. 14/069,348, filed on Oct. 31, 2013. Preferred compatibilizers are polyethers comprising butyleneoxide units, and more preferably are polybutyleneoxide homopolymers or poly(butyleneoxide-propyleneoxide) copolymers. The compatibilizers may optionally be end-capped, preferably the compatibilizers have one end cap, and more preferably two end caps. It is further preferred that the compatibilizers have a number average molecular weight of from 300 to 7500, more preferably from 500 to 6000, and yet more preferably from 500 to 5000 Da. Suitable curing agents may aid in the curing of the adhesive material, and may be activated by heat or light. Exemplary curing agents include, but are not limited to, thermally generated initiators, photoinitiators, azides, nitrenes, and crosslinking agents such as polyamines and polythiols. Thickening agents include any materials that increase the viscosity of the temporary bonding composition, such as to reduce bleed out of the composition from between the carrier and active device before the adhesive material has fully cured. Thickening agents also include low molecular weight materials that may be quickly advanced (polymerized) in order to increase the viscosity of the temporary bonding composition in use.

The temporary bonding compositions comprise one or more curable adhesive materials in an amount of 50 to 99 wt %, one or more release additives in an amount of 1 to 50 wt %, one or more copper passivation agents in an amount of 0.01 to 10 wt %, optionally organic solvent, and optionally one or more additional components. The curable adhesive material is preferably present in an amount of 50 to 95 wt %. It is preferred that the release additive is present in an amount of 2 to 50, more preferably from 5 to 45, and even more preferably from 5 to 40 wt %. Preferably, the copper passivation agent is present in an amount of 0.01 to 5 wt %, more preferably from 0.01 to 2.5 wt %, and even more preferably from 0.01 to 2 wt %. When lower amounts of copper passivation agent are used, such as ≤0.05 wt %, it is preferred that a polyetheramine is used as the release additive, and more preferably a combination of a polyether and a polyetheramine is used as the release additive. When present, the amount of organic solvent is preferably sufficient to dissolve or disperse, and preferably dissolve, the curable adhesive material, the release additive, the copper passivation agent, and any optional additional components. The amount of organic solvent is typically from 0 to 50 wt %. Preferably, an organic solvent is used. Optionally, one or more compatibilizers may be used in an amount of 0 to 40 wt %, and preferably in an amount of 1 to 40 wt %, based on the total weight of the composition. Other additional components may each be present in an amount of from 0 to 15 wt %. The present temporary bonding compositions may be prepared by combining the curable adhesive material, the release additive, the copper passivation agent, and any optional additional components in any order.

In use, the present temporary bonding compositions may be disposed by any suitable method on the attachment surface of the carrier substrate, the front side of the semiconductor substrate having a copper surface, or on both surfaces. Suitable methods for disposing the temporary bonding composition include, but are not limited to, spin-coating, curtain coating, spray coating, roller coating, dip coating, vapor deposition, and lamination such as vacuum lamination, among other methods. In the semiconductor manufacturing industry, spin-coating is a preferred method to take advantage of existing equipment and processes. In spin-coating, the solids content of the composition may be adjusted, along with the spin speed, to achieve a desired thickness of the composition on the surface it is applied to. Typically, the present compositions are spin-coated at a spin speed of 400 to 4000 rpm. The amount of the temporary bonding composition dispensed on the semiconductor substrate or carrier substrate depends on the total solids content in the composition, the desired thickness of the resulting temporary bonding layer, and other factors well-known to those skilled in the art. When a film or layer of the temporary bonding composition is cast, such as by spin-coating, much (or all) of the solvent evaporates during deposition of the film. Preferably, after being disposed on a surface, the temporary bonding composition is heated (baked) to remove any remaining solvent. Typical baking temperatures are from 90 to 160° C., although other temperatures may be suitably used. Such baking to remove residual solvent is typically done for approximately 2 minutes, although longer or shorter times may suitably be used.

In an alternate preferred method, the temporary bonding composition is formed as a dry film and is disposed on the attachment surface of the carrier substrate, the front side of the semiconductor substrate having a copper surface, or on both surfaces by lamination. A variety of suitable lamination techniques, including vacuum lamination techniques, may be used and are well known to those skilled in the art. In forming a dry film, the temporary bonding composition is first disposed onto a front surface of a suitable film support sheet such as a polyester sheet, preferably polyethyleneterephthalate (PET) sheet, or a polyimide sheet such as KAPTON™ polyimide, using slot-die coating, gravure printing, or another appropriate method. The composition is then soft baked at a suitable temperature, such as from 90 to 140° C., for an appropriate time, such as from 1 to 30 minutes, to remove any solvent. A polymer film cover sheet such as polyethylene is then roll-laminated at room temperature onto the dried temporary bonding composition to protect the composition during storage and handling. To dispose the dried temporary bonding composition onto the carrier and/or the semiconductor substrate, the cover sheet is first removed. Then, the dried temporary bonding composition on the support sheet is laminated onto the appropriate surface using roll-lamination or vacuum lamination. The lamination temperature can range from 20 to 120° C. The support sheet is then removed (peeled), leaving the dried temporary bonding composition on that surface. Using this method, the structures illustrated in FIGS. 1A, 1B, and 1C can all be realized.

Figure 1B:
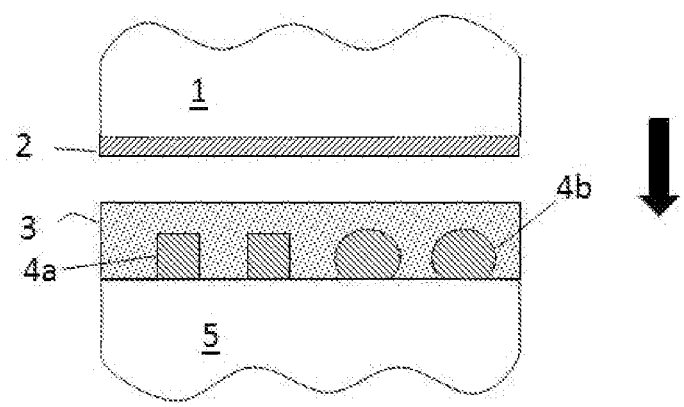
Figure 1C:
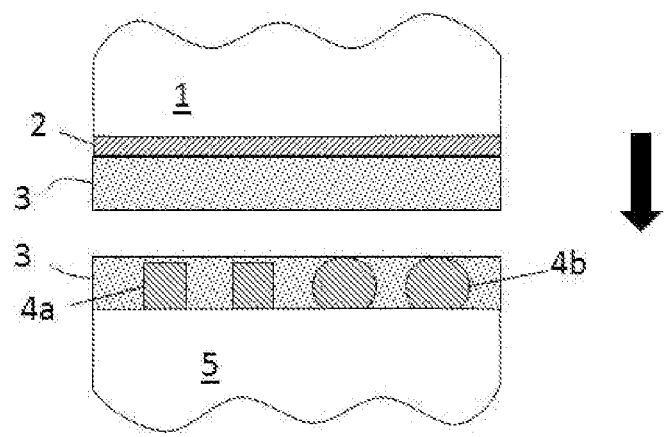

FIG. 1A illustrates a first embodiment of the invention where temporary bonding composition 3 is disposed, such as by spin-coating, on optional adhesion promoter layer 2 on the attachment surface of carrier FIG. 1B illustrates an alternate embodiment of the invention where temporary bonding composition 3 is disposed on the front surface of semiconductor substrate (illustrated as a wafer) 5 having copper-containing interconnect features in the form of copper pillars 4a, and may optionally have other interconnect features such as solder bumps 4b, which may also have a copper surface. It will be appreciated by those skilled in the art that a semiconductor wafer may have only one type of copper-containing feature, such as copper pillars, or a variety of copper-containing features. Temporary bonding composition 3 in FIG. 1B is sufficiently flowable to fill-in around copper pillars 4a and optional solder bumps 4b. In FIG. 1B, the attachment surface of carrier substrate 1 has optional adhesion promoter layer 2. FIG. 1C illustrates a third embodiment of the invention where temporary bonding composition 3 is disposed both on the front side of semiconductor wafer 5 and on the attachment surface of carrier substrate 1 having adhesion promoter layer 2. Temporary bonding composition 3 in FIG. 1C is sufficiently flowable to fill-in around copper pillars 4a and optional solder bumps 4b. In FIG. 1C, the temporary bonding composition disposed on the semiconductor wafer may be the same as, or different from, the temporary bonding disposed on the attachment surface of the carrier substrate. It will be appreciated by those skilled in the art that multiple layers of the temporary bonding composition may be applied in order to achieve the desired thickness.

After the temporary bonding composition is disposed on the front side of the semiconductor wafer having a copper surface or the attachment surface of the carrier substrate, a structure is formed by bringing the attachment surface of the carrier wafer or the front surface of the semiconductor wafer having a copper surface, respectively, into contact with the temporary bonding composition, as illustrated by the arrows in FIGS. 1A and 1B. After the temporary bonding composition is disposed on both the front side of the semiconductor wafer having a copper surface and the attachment surface of the carrier substrate, a structure is formed by bringing the two temporary bonding composition layers into contact, as illustrated by the arrow in FIG. 1C. Any suitable method may be used to bring into contact the carrier substrate, semiconductor wafer and temporary bonding composition, such as by thermocompression bonding, where pressure and heat are applied. Exemplary methods are described in U.S. Pat. No. 7,713,835 and in U.S. Pat. App. Pub. Nos. 2010/0263794 and 2011/0272092. Typically, thermocompression bonding is carried out under vacuum in order to reduce voiding. It is preferred that both the carrier substrate and the semiconductor wafer are placed in a vacuum chamber, the temporary bonding composition disposed on at least one of the carrier substrate and the wafer is then heated to a desired temperature, such as 50 to 200° C. for 1 to 10 minutes in the case of an arylcyclobutene adhesive material, next the chamber is evacuated and the carrier substrate and the semiconductor wafer are contacted to the temporary bonding composition, and the chamber is then optionally pressurized, such as to 1 to 100 kPa. Next, the bonded pair may be removed from the chamber and cured, or optionally cured within the chamber. Curing of the temporary bonding composition is typically achieved by heating the composition to a temperature of 180 to 250° C. for 1 to 600 minutes in the case of an arylcyclobutene adhesive material.

Figure 2A:
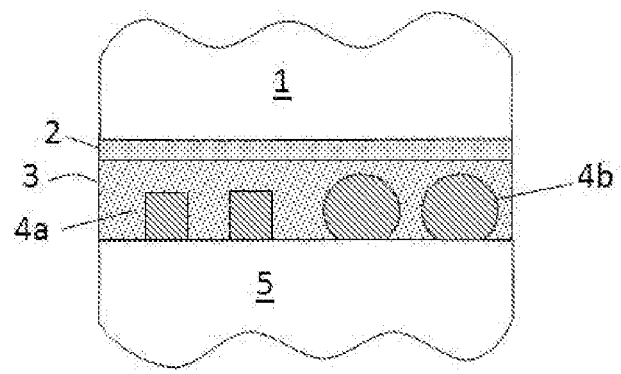
FIGS. 2A-2F are schematic diagrams illustrating the process of the invention.

FIG. 2A illustrates a structure formed after the components illustrated in each of FIGS. 1A-1C are brought into contact. In FIG. 2A, semiconductor wafer 5 has interconnect features shown as copper pillars 4a and solder bumps 4b which may or may not have a copper surface, temporary bonding composition 3 is directly adjacent semiconductor wafer 5 and is disposed around features 4a and 4b, the temporary bonding composition is also directly adjacent to optional adhesion promoter layer 2 which is directly adjacent carrier substrate 1. Once the structure in FIG. 2A is formed, the temporary bonding composition is then subjected to conditions sufficient to cure the adhesive material. Such conditions include heating, exposure to actinic radiation (light) or a combination thereof. Preferably, heating is used, either alone or in combination with exposure to light, and more preferably the adhesive material is cured by heating. The rate of heating is chosen such that the adhesive material does not cure instantaneously, but cures in a more controlled manner. That is, the rate of polymerization must be less than the rate of phase separation of the release additive. Prior to and/or during the step of curing the adhesive material, the copper passivation agent coats the copper surface.

Figure 2B:
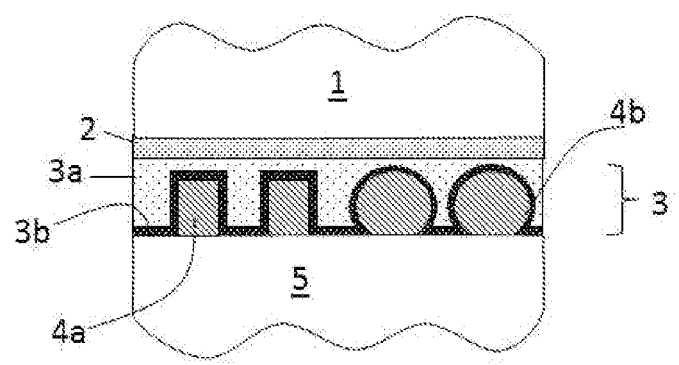

During curing, without being bound by theory, it is believed that the release additive phase separates from the curing adhesive material (that is, polymerization induced phase separation occurs) and generally migrates toward the relatively more hydrophilic surface (front side) of the semiconductor wafer. The passivation agent coats the copper surfaces before and/or during the step of curing the adhesive material. Following curing, a temporary bonding layer is formed between the semiconductor wafer and the attachment surface of the carrier substrate as illustrated in FIG. 2B, where the cured temporary bonding composition (now the temporary bonding layer) 3 is composed of a first region 3a adjacent to the carrier wafer comprising a relatively lower amount of release additive and a second region 3b adjacent to the semiconductor wafer and comprising a relatively higher (greater) amount of release additive. Region 3b is relatively smaller as compared to region 3a. FIG. 2B shows defined regions 3a and 3b only for purposes of illustration. It is believed, without being bound by theory, that regions 3a and 3b may represent a continuum of concentrations (from lower at 3a to higher at 3b) of the release additive in the temporary bonding layer or they may represent distinct regions comprising different concentrations of the release additive, where region 3b may comprise a predominant amount of release additive. Whether regions 3a and 3b represent distinct regions or a continuum, region 3b predominantly comprises the release additive. When the cured adhesive material (temporary bonding layer) is composed of an arylcyclobutene adhesive material, such cured material typically has a modulus of >1 GPa, and an elongation of <20% at the breaking point.

Figure 2C:
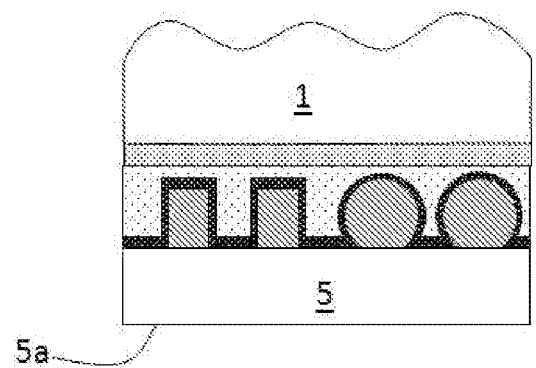
Figure 2D:
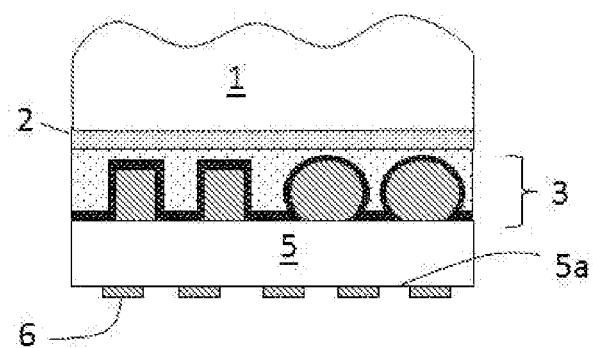

Once the temporary bonding layer is formed, one or more suitable operations may be performed on the semiconductor wafer, such as grinding (thinning) the backside of the wafer, as illustrated in FIG. 2C where the backside of semiconductor wafer 5 has been ground (thinned) and a flat surface 5a formed. Further operations may be performed, such as patterning, the formation of via holes, and the formation of conductive contacts on the backside of the semiconductor wafer. FIG. 2D illustrates a structure having carrier substrate 1 having an optional adhesion promoter layer 2, temporary bonding layer 3 joining semiconductor wafer 5 to carrier substrate 1, where the temporary bonding layer surrounds interconnect features, such as copper pillars and/or solder bumps having a copper surface on the front side of the semiconductor wafer, where the backside of wafer 5 has been ground and metal contacts 6 formed thereon.

The greater concentration of release additive adjacent, and preferably directly adjacent, to the front side of the semiconductor substrate relative to the concentration of the release additive in the temporary bonding layer adjacent to the carrier substrate provides a structure having a lower adhesion energy between the semiconductor substrate and the temporary bonding layer as compared to the adhesion energy between the carrier substrate and the temporary bonding layer. Preferably, the difference in adhesion energy between the semiconductor substrate-temporary bonding layer interface and the carrier substrate-temporary bonding layer interface is >20 $J/m^2$, and more preferably >25 $J/m^2$. The adhesion energy between the temporary bonding layer and the front side of a semiconductor substrate that does not have interconnect structures is ≤5 $J/m^2$, preferably <5 $J/m^2$, more preferably <3 $J/m^2$, and most preferably ≤2 $J/m^2$. The adhesion energy between the temporary bonding layer and the attachment surface of the carrier substrate is preferably >30 $J/m^2$, more preferably >35 $J/m^2$, and yet more preferably ≥40 $J/m^2$. Such differences in adhesion energy allows for easier release of the semiconductor wafer from the temporary bonding layer as compared to the carrier substrate.

Figure 2E:
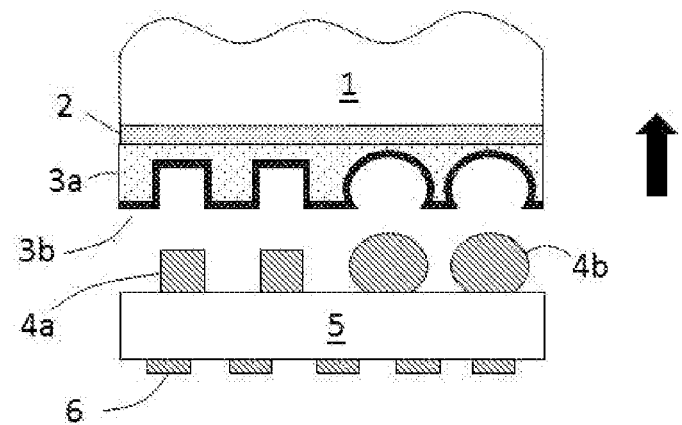
Figure 2F:
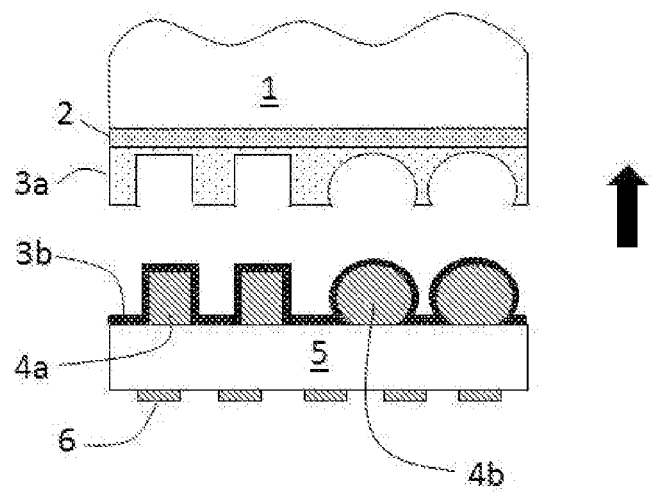

After completion of the operations to be performed on the semiconductor substrate, the semiconductor substrate is then separated from the carrier substrate and the temporary bonding layer. Any suitable method for separating the semiconductor substrate from the temporary bonding layer may be used, such as those disclosed in U.S. Pat. App. Pub. Nos. 2010/0263794; 2011/0308739; and 2012/0028438, and Int. Pat. App. No. WO 2011/079170. The structure may optionally be heated in order to facilitate separation of the semiconductor wafer, but such heating is not required. An advantage of the present invention is that with such low adhesion energy between the temporary bonding layer and the semiconductor substrate, separation is easily achieved by forcing a wedge between the semiconductor substrate and the carrier substrate to force or pry apart the structure. Once separation initiates, the semiconductor substrate is easily separated from the temporary bonding layer. FIG. 2E illustrates one aspect of the invention showing processed semiconductor substrate (illustrated as a wafer) 5 having interconnect features shown as copper pillars 4a and solder bumps 4b on the front side and conductive contacts 6 on the back side separating from carrier substrate 1 having optional adhesion promoter layer 2, and both regions 3a and 3b of the temporary bonding layer. The processed semiconductor wafer 5 is then rinsed with an appropriate solvent or solvent mixture to remove any residue, and then dried. Suitable rinse agents include, without limitation, isopropanol, acetone, mesitylene, ammonia/water, water/surfactant, and the like. FIG. 2F illustrates an alternate aspect where region 3b remains on the front side of the semiconductive wafer following separation, which is then easily removed by contacting semiconductor wafer 5 with an appropriate solvent or solvent mixture followed by drying. As illustrated in FIGS. 2E and 2F, the present temporary bonding layer is able to be removed from the surface of a semiconductive substrate, even from areas having topographic features such as metal pillars and solder bumps, leaving little to no cured adhesive material residue.

Certain interconnect features, such as solder bumps and pillars present challenges in removing any temporary bonding layer due to their size and shape of the features, as well as the relative density of such features in a given area. This leads to an increase in surface area and in the case of C4 bumps, a reentrant profile near the semiconductor substrate surface. The reentrant profile or overhang significantly increase the difficulty for low energy debonding of the adhesive. Accordingly, higher amounts of release additive may be required in the present temporary bonding compositions in order to ensure good release of a semiconductor substrate having these interconnect features. Higher amounts of release additive will result in a larger region (3b in FIG. 2B) that predominantly comprises the release additive adjacent to the front side of the semiconductor substrate, which will facilitate separation of the wafer in areas having such topographic features. The passivation agents of the present invention coat the copper surfaces on the front side of the semiconductor substrate. It is easier to separate the temporary bonding layer from such passivated copper surfaces, particularly passivated copper-containing interconnect structures such as passivated copper pillars, than from copper surfaces that have not been passivated.

Semiconductor Wafer Coating:

Semiconductor wafers were coated on a Site Service Tractrix spin-coating system with an integrated hot plate and wafer transfer system. An amount (6-8 g) of a sample was disposed on an untreated silicon wafer using a dynamic dispense and a spin speed of 1000 to 2000 rpm for up to 45 seconds, followed by soft bake at 120° C. for 90 seconds on a hot plate. The final coating thickness was inversely dependent on spin speed and typically ranged from 25 to 100 μm.

Carrier Substrate Coating:

Unless otherwise specified, carrier wafers were prepared for the bonding study by treating the wafer surface with a poly(alkoxysilane) adhesion promoter (AP-9000S™ Adhesion Promoter available from Dow Electronic Materials) to enhance adhesion of the temporary bonding layer after cure. The adhesion promoter was applied using a spin-coater with a static dispense followed by spinning at 2000 rpm for 45 seconds and a hot plate bake step at 100° C. for 2 minutes.

Semiconductor Wafer to Carrier Substrate Bonding:

A semiconductor wafer piece and a carrier wafer piece, one having a layer of temporary bonding composition disposed thereon, were bonded by heating on a hot plate placing in direct contact and then attaching a clamp to prevent the parts from sliding apart. Alternatively, the wafer pieces were bonded in a vacuum laminator. The samples were then cured in a rapid thermal annealing chamber or nitrogen furnace at 210° C. for 1 hour.

EXAMPLE 1: CONTROL

A 100 mm silicon wafer, used as received, was spin-coated with a temporary bonding composition comprising adhesive containing DVS-bisBCB oligomer with 8 wt % by solids of ethyleneoxide-butyleneoxide-ethyleneoxide triblock polymer having a $M_n$ of 6700 (FORTEGRA™ 100, available from The Dow Chemical Company) as the release additive and 16 wt % by solids of a polybutyleneoxide monododecylphenyl ether having a $M_n$ of 1800 as a compatibilizer. The coated wafer was bonded to a 100 mm silicon carrier wafer coated with 200 nm of pure DVS-bisBCB polymer that had been cured at 210° C. for 1 min. After curing of the bonded wafer pair at 210° C. for 1 hour, the wafers could be easily separated by insertion of a razor blade between the wafers.

EXAMPLE 2: COMPARATIVE 1

The procedure of Example 1 was repeated except that silicon wafer was replaced with a 100 mm silicon wafer having sputtered copper surface, and the temporary bonding composition was applied to the copper surface. After curing of the bonded wafer pair, the wafers could not be separated by insertion of a razor blade between the wafers.

EXAMPLE 3: COMPARATIVE 2

The procedure of Example 2 was repeated except that the copper surface of the silicon wafer was first cleaned using Ar plasma at these conditions: power=250 W, pressure=300 mTorr, Ar flow=170 sccm, plasma time=90 sec. The temporary bonding composition was applied to the plasma cleaned copper surface. The coated wafer was bonded to a 100 mm silicon carrier wafer coated with 200 nm of pure DVS-bisBCB polymer that had been cured at 210° C. for 1 min. The bonded pair of wafers was then cured at 210° C. for 1 hour. After curing, the wafers could not be separated by insertion of a razor blade between the wafers. Next, the cured bonded wafer pair was further cured at 260° C. for 5 minutes and then allowed to cool to room temperature. After this further high temperature curing step, the wafers could be separated by insertion of a razor blade between the wafers.

EXAMPLE 4: COMPARATIVE 3

A 100 mm silicon wafer having a surface coated with sputtered copper, used as received, was spin-coated with a layer of a temporary bonding composition comprising 75 wt % DVS-bis BCB oligomer as the adhesive material, 8 wt % by solids of ethyleneoxide-butyleneoxide-ethyleneoxide triblock polymer having a $M_n$ of 6700 as the release additive, 16 wt % by solids of a polybutyleneoxide monododecylphenyl ether having a $M_n$ of 1800 as the compatibilizer, and 1 wt % by solids of a phenolic antioxidant (IRGANOX 1010), having 68.4 wt % total solids in PROGLYDE™ DMM solvent (The Dow Chemical Company). The layer of the temporary bonding composition is then dried at 120° C. for 2 min. This coated water was bonded to a 100 mm silicon carrier wafer that was coated with a thin layer of AP-9000S adhesion promoter (The Dow Chemical Company) and then dried at 100° C. for 2 min. After curing of the bonded wafer pair at 210° C. for 1 hour under a nitrogen atmosphere, the wafers could not be separated by insertion of a razor blade between the wafers.

EXAMPLE 5: COMPARATIVE 4

The procedure of Example 4 was repeated except that the temporary bonding composition was replaced with a temporary bonding composition comprising 79 wt % DVS-bisBCB oligomer as the adhesive material, 13 wt % by solids of poly(tetramethylene glycol), having a molecular weight of 2900, (available as PolyTHF 2900, from BASF) as the release additive, 6 wt % by solids of BAC-45 (a diacrylate terminated butadiene rubber having a molecular weight of 3000), 1 wt % by solids of dicumyl peroxide, and 0.7 wt % by solids of a phenolic antioxidant (IRGANOX™ 1010), having 68.7 wt % total solids in PROGLYDE™ DMM solvent. After curing of the bonded wafer pair at 210° C. for 1 hour under a nitrogen atmosphere, the wafers could not be separated by insertion of a razor blade between the wafers.

EXAMPLE 6: COMPARATIVE 5

The procedure of Example 4 was repeated except that the temporary bonding composition further comprised 0.8 wt % by solids of benzotriazole. After curing of the bonded wafer pair at 210° C. for 1 hour under a nitrogen atmosphere, the wafers could not be separated by insertion of a razor blade between the wafers.

EXAMPLE 7

A 100 mm silicon wafer having a surface coated with sputtered copper, used as received, was spin-coated with a layer of a temporary bonding composition comprising 75 wt % DVS-bis BCB oligomer as the adhesive material, 8 wt % by solids of ethyleneoxide-butyleneoxide-ethyleneoxide triblock polymer having a $M_n$ of 6700 as the release additive, 16 wt % by solids of a polybutyleneoxide monododecylphenyl ether having a $M_n$ of 1800 as the compatibilizer, 1 wt % by solids of a phenolic antioxidant (IRGANOX 1010), and 0.8 wt % by solids of 5-methyl-1H-benzotriazole as a copper passivation agent, having 68.4 wt % total solids in PROGLYDE™ DMM solvent (The Dow Chemical Company). The layer of the temporary bonding composition is then dried at 120° C. for 2 min. This coated water was bonded to a 100 mm silicon carrier wafer that was coated with a thin layer of AP-9000S adhesion promoter (The Dow Chemical Company) and then dried at 100° C. for 2 min. After curing of the bonded wafer pair at 210° C. for 1 hour under a nitrogen atmosphere, the wafers could be separated by insertion of a razor blade between the wafers.

EXAMPLE 8

The procedure of Example 7 was repeated except that the 5-methyl-1H-benzotriazole was replaced with 0.05 wt % by solids of 5-amino-1H-benzotriazole as a copper passivation agent. After curing, the wafers could be separated by insertion of a razor blade between the wafers.

EXAMPLE 9

A 100 mm silicon wafer having a surface coated with sputtered copper, used as received, was spin-coated with a layer of a temporary bonding composition comprising 79 wt % DVS-bisBCB oligomer as the adhesive material, 13 wt % by solids of poly(tetramethylene glycol), having a molecular weight of 2900, (available as PolyTHF 2900, from BASF) as the release additive, 6 wt % by solids of BAC-45 (a diacrylate terminated butadiene rubber having a molecular weight of 3000), 1 wt % by solids of dicumyl peroxide, and 0.7 wt % by solids of a phenolic antioxidant (IRGANOX™ 1010), and 0.8 wt % by solids of 5-methyl-1H-benzotriazole as a copper passivation agent, having 68.4% total solids in PROGLYDE™ DMM solvent (The Dow Chemical Company). The layer of the temporary bonding composition is then dried at 120° C. for 2 min. This coated water was bonded to a 100 mm silicon carrier wafer that was coated with a thin layer of AP-9000S adhesion promoter (The Dow Chemical Company) and then dried at 100° C. for 2 min. After curing of the bonded wafer pair at 210° C. for 1 hour under a nitrogen atmosphere, the wafers could be separated by insertion of a razor blade between the wafers.

EXAMPLE 10

The procedure of Example 9 was repeated except that the 5-methyl-1H-benzotriazole was replaced with 0.05 wt % by solids of 5-amino-1H-benzotriazole as a copper passivation agent. After curing, the wafers could not be separated by insertion of a razor blade between the wafers, indicating that a higher amount of copper passivation agent may be needed for this formulation.

EXAMPLES 11-12

The procedure of Example 7 was repeated except that the 5-methyl-1H-benzotriazole was replaced with 0.05 wt % by solids of benzotriazole-5-carboxylic acid (Example 11) or with 0.01 wt % by solids of benzotriazole-5-carboxylic acid (Example 12) as the copper passivation agent. After curing, the wafers from both Examples 11 and 12 could be separated by insertion of a razor blade between the wafers.

EXAMPLE 13

The procedure of Example 9 was repeated except that the 5-methyl-1H-benzotriazole was replaced with 0.01 wt % by solids of benzotriazole-5-carboxylic acid. After curing, the wafers could not be separated by insertion of a razor blade between the wafers, indicating that a higher amount of copper passivation agent may be needed for this composition.

EXAMPLES 14-20

The procedure of Example 7 was repeated numerous times except that the 5-methyl-1H-benzotriazole was replaced with methyl 1,2,3-benzotriazole-5-carboxylate as the copper passivation agent in the amounts shown in Table 1. After curing, the bonded wafer pairs were evaluated for release by the insertion of a razor blade between the wafers. The wafer pairs for each of Examples 14-19 could be easily separated. The wafer pair of Example 20 could not be separated by insertion of the razor blade between the wafers, indicating that an amount of copper passivation agent that is >0.001 wt % of solids may be needed.

TABLE 1

| Example | Copper Passivation Agent (wt % by solids) | Release of Bonded Wafer Pair After Curing |
|---|---|---|
| 14 | 0.8 | Yes |
| 15 | 0.4 | Yes |
| 16 | 0.2 | Yes |
| 17 | 0.1 | Yes |
| 18 | 0.05 | Yes |
| 19 | 0.01 | Yes |
| 20 | 0.001 | No |

EXAMPLES 21-22

The procedure of Example 9 was repeated except that the 5-methyl-1H-benzotriazole was replaced with 0.8 wt % by solids of methyl 1,2,3-benzotriazole-5-carboxylate (Example 21) or with 0.05 wt % by solids of methyl 1,2,3-benzotriazole-5-carboxylate (Example 22) as the copper passivation agent. After curing, the wafer pairs from both Examples 21 and 22 could be easily separated by insertion of a razor blade between the wafers.

EXAMPLES 23-26

The procedure of Example 7 was repeated numerous times except that the 5-methyl-1H-benzotriazole was replaced with 5-chlorobenzotriazole as the copper passivation agent in the amounts shown in Table 2. After curing, the bonded wafer pairs were evaluated for release by the insertion of a razor blade between the wafers. The wafer pairs for each of Examples 23-26 could be easily separated, as indicated in Table 2.

TABLE 2

| Example | Copper Passivation Agent (wt % by solids) | Release of Bonded Wafer Pair After Curing |
|---|---|---|
| 23 | 0.8 | Yes |
| 24 | 0.4 | Yes |
| 25 | 0.2 | Yes |
| 26 | 0.1 | Yes |

EXAMPLE 27

The procedure of Example 9 was repeated except that the 5-methyl-1H-benzotriazole was replaced with 0.8 wt % by solids of 5-chlorobenzotriazole as the copper passivation agent. After curing, the wafers could be easily separated by insertion of a razor blade between the wafers.

EXAMPLES 28-31

The procedure of Example 9 was repeated numerous times except that the amount of the 5-methyl-1H-benzotriazole was varied as shown in Table 3. After curing, the bonded wafer pairs were evaluated for release by the insertion of a razor blade between the wafers. The wafer pairs for each of Examples 28-30 could be easily separated. The wafer pair of Example 31 could not be separated by insertion of the razor blade between the wafers, indicating that an amount of copper passivation agent that is >0.05 wt % may be needed in this formulation.

TABLE 3

| Example | Copper Passivation Agent (wt % by solids) | Release of Bonded Wafer Pair After Curing |
|---|---|---|
| 28 | 0.4 | Yes |
| 29 | 0.2 | Yes |
| 30 | 0.1 | Yes |
| 31 | 0.05 | No |

EXAMPLE 32

Each of four 100 mm silicon wafer test vehicles having a 25 μm copper pillar array was spin-coated with one layer of a temporary bonding composition. Temporary bonding composition A contained 75 wt % DVS-bis BCB oligomer as the adhesive material, 8 wt % of solids of ethyleneoxide-butyleneoxide-ethyleneoxide triblock polymer having a $M_n$ of 6700 as the release additive, 16 wt % of solids of a polybutyleneoxide monododecylphenyl ether having a $M_n$ of 1800 as the compatibilizer, and 1 wt % of solids of a phenolic antioxidant (IRGANOX 1010), having 68.4 wt % total solids in PROGLYDE™ DMM solvent. Temporary bonding composition B was the same as A, but further included 2.5 wt % of solids of an amine-terminated polypropylene oxide polymer having an average molecular weight of 2000 (JEFFAMINE D-2000) as a supplemental release additive. Temporary bonding composition C was the same as A, but further included 0.025 wt % of solids of benzotriazole-5-carboxylic acid as copper passivation agent. Temporary bonding composition D was the same as A, but further included 2.5 wt % of solids of an amine-terminated polypropylene oxide polymer having an average molecular weight of 2000 (JEFFAMINE D-2000) as a supplemental release additive and 0.025 wt % of solids of benzotriazole-5-carboxylic acid as a copper passivation agent. Each coated wafer was bonded to a 100 mm silicon carrier wafer that was coated with a thin layer of AP-9000S adhesion promoter and then dried at 120° C. for 2 min. After curing of the bonded wafer pair at 210° C. for 1 hour under a nitrogen atmosphere, the bonded wafer pairs were evaluated for release by the insertion of a razor blade between the wafers. The wafer pairs formed from Samples A to C did not debond. Only the wafer pair formed from Sample D was easily debonded.

What is claimed is:
1. A method of releasably attaching a semiconductor substrate to a carrier substrate comprising:
   (a) providing a semiconductor substrate having a front side and a back side, the front side having a copper surface;
   (b) providing a carrier substrate having an attachment surface;
   (c) disposing a temporary bonding composition comprising a curable adhesive material, a release additive, and a copper passivation agent between the front side of the semiconductor substrate and the attachment surface of the carrier substrate, wherein the release additive is chosen from polyether compounds, polyetheramine compounds, and mixtures thereof;
   (d) curing the curable adhesive material to provide a temporary bonding layer disposed between the front side of the semiconductor substrate and the attachment surface of the carrier substrate; wherein the temporary bonding layer adjacent to the attachment surface of the carrier substrate comprises a relatively lower amount of the release additive and the temporary bonding layer adjacent to the front side of the semiconductor substrate comprises a relatively higher amount of the release additive;

(e) performing an operation on the back side of the semiconductor substrate; and (f) separating the front side of the semiconductor substrate from the temporary bonding layer.

2. The method of claim 1 wherein the curable adhesive material is chosen from polyarylene oligomers, cyclic-olefin oligomers, arylcyclobutene oligomers, vinyl aromatic oligomers, and mixtures thereof.

3. The method of claim 1 wherein the polyether compounds are chosen from polyalkylene oxide homopolymers, polyalkylene oxide copolymers, and mixtures thereof.

4. The method of claim 1 wherein the copper passivation agent contains a nitrogen-containing heteroaromatic ring moiety.

5. The method of claim 4 wherein the copper passivation agent is a nitrogen-containing heteroaromatic compound having one or more hydrogens on an aromatic ring replaced with one or more substituents chosen from $C_{1-10}$ alkyl, $C_{6-10}$ aryl, $C_{7-20}$ aralkyl, $C_{2-10}$ alkenyl, $C_{1-10}$ alkoxy, carboxy, $C_{1-10}$ alkoxycarbonyl, carb-$C_{1-10}$-alkoxy, sulfoxy, hydroxy, thiol, $C_{1-10}$ alkylmercaptan, $C_{6-10}$ arylmercaptan, amino, $C_{1-10}$ alkyl amino, di-$C_{1-10}$-alkylamino, $C_{6-10}$ aryl amino, di-$C_{6-10}$-arylamino, $C_{1-10}$ amido, $C_{2-50}$ alkylamido, $C_{3-50}$ dialkylamido, and halogen.

6. The method of claim 1 further comprising the step of treating the attachment surface of the carrier substrate with an adhesion promoter prior to contact with the temporary bonding composition.

7. The method of claim 1 wherein the polyether compound is a poly $C_{1-4}$ alkyleneoxide compound.

8. The method of claim 1 wherein the release additive is chosen from polyethylene glycol, polypropylene glycol, poly(1,3-propanediol), poly(tetrahydrofuran), ethylene oxide (EO)-propylene oxide (PO) copolymers, EO-butylene oxide (BO) copolymers, amine terminated polypropylene oxide, polyalkylene oxide functionalized polyamines, and mixtures thereof.

9. The method of claim 1 wherein the copper passivation agent does not react with the adhesive material under conditions of storage and use, and does not cure under the conditions employed to cure the adhesive material.

10. The method of claim 1 wherein the copper passivation agent is chosen from $C_{1-10}$ alkylbenzimidazole, aminobenzimidazole, $C_{1-10}$ alkylaminobenzimidazole, di-$C_{1-10}$-alkylbenzimidazole, $C_{6-10}$ arylbenzimidazole, carboxybenzimidazole, $C_{1-10}$ alkoxycarbonylbenzimidazole, halobenzimidazole, $C_{1-10}$ alkylbenzotriazole, aminobenzotriazole, $C_{1-10}$ alkylaminobenzotriazole, di-$C_{1-10}$-alkylbenzotriazole, $C_{6-10}$ arylbenzotriazole, carboxybenzotriazole, $C_{1-10}$ alkoxycarbonylbenzotriazole, $C_{1-10}$ amidobenzotriazole, $C_{2-50}$ alkylamidobenzotriazole, $C_{3-50}$ dialkylamidobenzotriazole and halobenzotriazole.

* * * * *